United States Patent [19]
Gibson et al.

[11] 4,038,439
[45] July 26, 1977

[54] METHOD FOR PRODUCING SELECTED ALIGNMENT IN LIQUID CRYSTAL

[75] Inventors: Roy Morris Gibson; Gerard John Sprokel, both of San Jose, Calif.

[73] Assignee: International Business Machines Corporation, Armonk, N.Y.

[21] Appl. No.: 724,439

[22] Filed: Sept. 20, 1976

[51] Int. Cl.² .............................................. B05D 3/06
[52] U.S. Cl. .................................. 427/38; 29/576 R; 350/160 LC; 427/41; 427/163; 427/164
[58] Field of Search .................... 427/38, 39, 41, 162, 427/163, 164, 399; 350/160 LC; 29/576 R

[56] References Cited

U.S. PATENT DOCUMENTS

| | | | |
|---|---|---|---|
| 3,834,792 | 9/1974 | Janning | 350/160 LC |
| 3,864,021 | 2/1975 | Katagiri et al. | 350/160 LC |
| 3,938,242 | 2/1976 | Sussman | 29/576 R |
| 3,941,901 | 3/1976 | Harsch | 350/160 LC |
| 3,966,305 | 6/1976 | Young | 350/160 LC |
| 3,989,354 | 11/1976 | Dubois et al. | 350/160 L C |

*Primary Examiner*—John H. Newsome
*Attorney, Agent, or Firm*—Joseph E. Kieninger

[57] ABSTRACT

A method of treating the surface of substrates used in liquid crystal display cells so that the surface forces the alignment of the liquid crystal layer to be either parallel with the substrate wall or perpendicular to it. The method includes the step of forming free radicals of either oxygen or fluorine in a radio frequency plasma and exposing the glass or tin doped indium oxide (ITO) substrate to the reaction products of the plasma in such a manner that electron or ion bombardment is avoided. When oxygen radicals only are employed, the surface forces parallel alignment. When the oxygen treatment is followed by exposure to fluorine free radicals, the surface forces perpendicular alignment. To provide strong parallel alignment in reflecting liquid crystal display cells having metal, glass or ITO surfaces, the method consists of producing an oxygen plasma as described above and introducing either a volatile organo-silicon or an organo tin compound into the plasma. The organo compound is completely oxidized in the plasma and the reaction product, $SiO_2$ or $SnO_2$, is carried by the gas stream onto the substrate which is placed well outside the plasma region where it forms a thin coherent deposit on the metal. To provide strong perpendicular alignment in display cells having metal, glass or ITO surfaces, the method consists of the oxygen treatment followed by exposure to a fluorine free radical plasma formed from an unsaturated polyfluorinated compound. A polymeric film is formed on the substrate by the in situ polymerization of the active fluorine species in the plasma.

14 Claims, 3 Drawing Figures

METHOD FOR PRODUCING SELECTED ALIGNMENT IN LIQUID CRYSTAL

BACKGROUND OF THE INVENTION

1. Field of the Invention

This invention relates to improved liquid crystal display cells and more particularly to a method for treating the surface of a substrate to provide for selected alignment.

2. Description of the Prior Art

The alignment of liquid crystal molecules in liquid crystal devices is important for obtaining a high contrast ratio. The alignment of the molecules can be parallel to the cell substrate (homogeneous alignment) or it can be perpendicular to the cell substrate (homeotropic alignment).

The desired alignment can be obtained by doping the liquid crystal material with a dopant or, alternatively, by treating the surface of the cell substrate. The preferred approach is to treat the substrate surface in some manner. Various approaches to align liquid crystals by treating the cell substrate are described in the following patents: The patent to Jones et al., U.S. Pat. No. 3,904,797 bakes ionic surfactants onto the cell substrate. The present to Sussman, U.S. Pat. No. 3,938,242 deposits a layer of metal on the substrate surface and subsequently oxidizes the metal layer. The patent to Harsch, U.S. Pat. No. 3,941,901 deposits a polymeric film on the cell substrate surface and then subjects it to a shear thinning technique. The patent to Kahn, U.S. Pat. No. 3,854,793 deposits a thin layer of a silane coupling agent on the substrate surface.

SUMMARY OF THE INVENTION

It is a primary object of this invention to provide an improved method of forcing a selected alignment in a liquid crystal display cell.

It is another object of this invention to provide an improved method for forcing a parallel alignment.

It is another object of this invention to provide an improved method for forcing perpendicular alignment.

These and other objects are accomplished by methods involving the steps of forming oxygen free radicals in an r.f. plasma. The oxygen free radicals are then transported away from said plasma and directed to the liquid crystal cell substrate. The oxygen free radical treated surface forces a parallel alignment. When the oxygen free radical treatment is followed by a fluorine free radical treatment, the surface forces a perpendicular alignment. Oxygen free radicals or fluorine free radicals may be used by themselves to provide an etching treatment for the cell substrate or in combination with other materials to deposit a surface film on the substrate.

Other objects of this invention will be apparent from the following detailed description, reference being made to the accompanying drawings wherein various embodiments of liquid crystal display cells made in accordance with the selected alignment method are shown.

DESCRIPTION OF THE ILLUSTRATIVE EMBODIMENT

Figure 1:
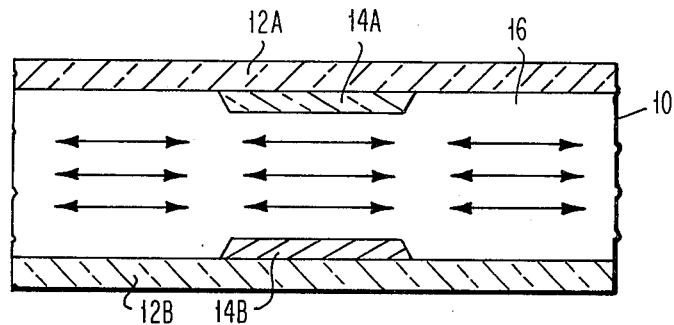
FIG. 1 is a cross-sectional view of a cell having a parallel alignment.

As shown in FIG. 1 a liquid crystal display cell 10 has a pair of polished glass substrates 12A and 12B. Provided on the facing surfaces of substrate 12A and 12B are film portions 14A and 14B, respectively, of a transparent conductive material such as tin-doped indium oxide. Between the substrate 12A and 12B and the transparent conductive material film portions 14A and 14B is a layer 16 of a positive dielectric liquid crystal material, such as pentylcyanobiphenyl. Typically, tin doped indium oxide film is deposited on the substrate 12A and 12B by commercially available radio frequency sputtering equipment as is well known in the art. The portions 14A and 14B are formed by etching using conventional photolithographic techniques which leave a layer of photoresist (not shown) on top of portions 14A and 14B.

In accordance with this invention the substrates 12A and 12B with the portions 14A and 14B are placed in a modified radio frequency (r.f.) plasma chamber (not shown). The chamber is evacuated and a gas is introduced that will form oxygen free radicals. Substantially pure oxygen gas is preferred in certain applications, whereas a mixture of gases, for example, argon and oxygen are used in other embodiments. The pressure of the oxygen is about 0.2 Torr. The discharge of the r.f. apparatus is started to form an oxygen plasma containing oxygen free radicals. The plasma chamber is constructed in such a manner so that the plasma is formed in one region and the substrates to be treated are in an area away from the plasma. As a result, the substrate surface is never exposed to the plasma itself, thereby avoiding surface changes by electron or ion bombardment. The oxygen free radicals move away from the plasma where they are formed to the substrates 12A and 12B and portions 14A and 14B where they produce surface changes thereon. The oxygen free radicals etch the substrates 12A and 12B and the portions 14A and 14B. The photoresist that had been on top of portions 14A and 14B is removed by this etching step. The liquid crystal cell 10 made with these treated surfaces is filled with the liquid crystal material 16. The resulting cell 10 has a treated surface which forces the alignment parallel to the surface as is shown in FIG. 1.

In accordance with this invention the structure shown in FIG. 1 can be formed with a treated surface with forces the alignment perpendicular to the surface rather than the parallel alignment shown. The perpendicular alignment is accomplished by taking the substrate that had been subjected to an oxygen free radical treatment, discontinuing the flow of oxygen into the plasma chamber and subjecting them to a treatment with fluorine free radicals. Fluorine free radicals may be formed by introducing a gas, for example, tetrafluoromethane, into the r.f. plasma. The fluorine free radicals that are formed in the plasma move to the substrate surface where the fluorine free radicals chemically bond to the substrate 12A and 12B and to the portions 14A and 14B. The cell formed with the surfaces treated in this manner has an alignment perpendicular to the substrate surface.

The substrate or surfaces that respond to the treatment described above are glass and tin-doped indium oxide. In certain liquid crystal display cells metals such as chrome/gold or aluminum are used. Another embodiment of this invention that is suitable for chrome/- gold and aluminum substrates as well as glass and tin-doped indium oxide will form a cell of the type shown in FIG. 2. The liquid crystal display cell 20 has transparent substrates 22A and 22B which are preferably polished glass. Positioned on the substrate 22A and 22B are conductive portions 24A and 24B. Conductive portions 24A and 24B may be transparent such as tin doped indium oxide or they may be reflective metals; such as chrome/gold or aluminum. On top of the substrates 22A and 22B and the conductive portions 24A and 24B are thin transparent films 25A and 25B, respectively. Positioned within the cell 20 is a positive dielectric liquid crystal material 26.

Figure 2:
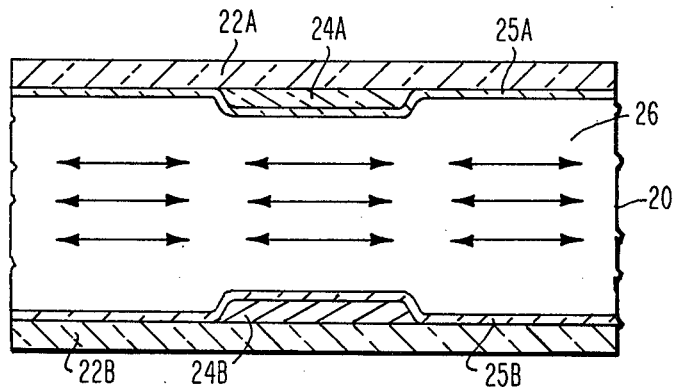
FIG. 2 is a cross-sectional view of a cell made to have parallel alignment.

In accordance with an alternate embodiment of the method of this invention, the display cell 20 has a treated surface which forces a parallel alignment as shown in FIG. 2. The method consists of depositing the conductive portions 24A and 24B on substrates 22A and 22B respectively, in the same manner as described in FIG. 1. Oxygen is introduced into the modified r.f. plasma chamber to form oxygen free radicals which then leave the plasma to react with the substrate 22A and 22B and the conductive portions 24A and 24B. The treatment with the oxygen free radicals is continued until the photoresist on top of portions 24A and 24B have been removed. At this point a volatile organo silicon compound is introduced into the r.f. plasma region. Preferably, the oxygen gas and the organo silicon compound vapor are mixed outside of the plasma chamber. Either volatile silanes or volatile siloxanes can be used since the important parameter is the vapor pressure and not the chemical composition. Non-limiting examples of suitable compounds are: Bis-(dimethylamino dimethyl)-silane (Silar No. 1420), allyl trimethyl silane (Silar 1010), divinyltetramethyl disiloxane (Silar 1154), cyanoethyltrimethyl silane (Silar No. 1061). The silicon compound vapor is completely oxidized to $SiO_2$ in the plasma region and the $SiO_2$ is carried by the gas stream to the substrate 22A and 22B and the conductive portions 24A and 24B where it is deposited as a thin film 25A and 25B, respectively, of $SiO_2$. The films 25A and 25B of $SiO_2$ must be free of hydrocarbon since polymerization caused by the presence of hydrocarbons is deleterious. The thickness of the film 25A and 25B is of the order of 100 to 500 angstroms. With this method parallel alignment is obtained regardless of the nature of the substrate, whether it is glass, tin-doped indium oxide or a conductive metal.

A structure similar to that shown in FIG. 2 having parallel alignment may be formed in accordance with another embodiment of this invention with a thin film of tin oxide, $SnO_2$, instead of $SiO_2$. In this embodiment a volatile organic tin compound instead of the volatile organo silcon compound is introduced to form a thin film 25A and 25B of $SnO_2$. Non-limiting examples of volatile organic tin compounds are tetrabutyl tin and tetramethyl tin.

Figure 3:
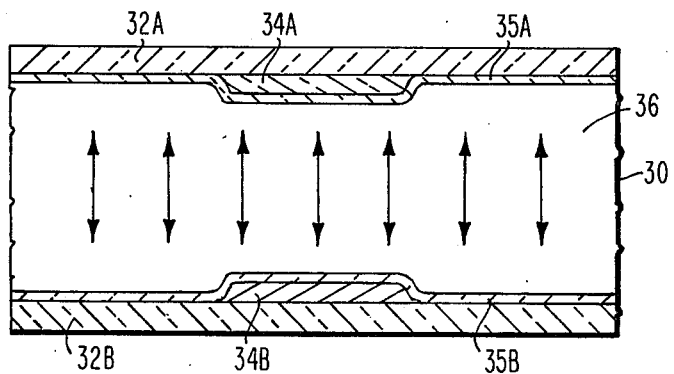
FIG. 3 is a cross-sectional view of a cell having a perpendicular alignment.

In accordance with another embodiment, the structure shown in FIG. 3 has treated surfaces which force perpendicular alignment. In FIG. 3 the liquid crystal display cell 30 has transparent substrates 32A and 32B, conductive portions 34A and 35B. A positive dielectric liquid crystal 36 is positioned between the film 35A and 35B. In this method, the conductive portions 34A and 34B are formed on the substrate 32A and 32B, respectively and subjected to an oxygen free radical treatment as described above. The flow of oxygen into the plasma chamber is then stopped. A material is then introduced in the plasma generating region which will form molecular excited species containing fluorine which will subsequently polymerize to form a polymeric film 35A and 35B. Polyfluorinated ethylene derivatives are non-limiting examples of materials useful for this purpose. A preferred compound is tetrafluoroethylene. The thickness of these polyfluorocarbon films 35A and 35B are of the order of 100 to 500 A. The polyfluorocarbon films 35A and 35B force the alignment to be perpendicular to the surface.

The method described in this invention is suitable for forming surfaces which force either parallel alignment or perpendicular alignment as desired. This method is suitable for use with the conventional substrates and the conductive metals used for both transmitive and reflective cells.

EXAMPLE 1

Polished glass substrates were coated with a layer of tin-doped indium oxide (ITO) about 1000 A thick using commercially available radio frequency sputtering equipment. The resistivity of the tin doped indium oxide was 100 ohms per square. A pattern, such as shown in FIG. 1, was etched using conventional photolithographic techniques which left a layer of photoresist on top of the tin doped indium oxide. The substrates were then placed in a modified r.f. plasma chamber and evacuated. Oxygen was introduced to provide a pressure of about 0.2 Torr. The substrate samples were placed so that they were not in the oxygen plasma that was formed. After 20 to 30 minutes the photoresist on top of the tin doped indium oxide was removed. The oxidation was continued for an additional 20 minutes. This caused the oxygen/indium ratio in ITO to increase from about 1.67 to 2.45. A cell made from two substrates which was filled with pentylcyanobiphenyl was aligned completely parallel as determined by capacitance measurements. The operating voltage of this cell was increased because the resistivity of the ITO layer was increased to about 1K to 10K ohms per square.

For applications in which the operation voltage is too high, it can be lowered by reducing the resistivity to 0.1K to 1K ohm per square by the following procedure. After the oxidation step has been completed, the oxygen flow is discontinued and the system is purged with Argon. It is then filled with a mixture of 95% $N_2$:5% H2. The r.f. discharge is started and the example is exposed to H. free radicals for about 30 minutes. A cell formed with substrates having this treatment also has complete parallel alignment, but has the advantage of lowered ITO layer resistivity.

EXAMPLE 2

The method employed in this example yields a structure similar to that shown in FIG. 2. The desired pattern is etched using conventional photolithography as described in Example 1. The pattern is not limited to ITO but also includes metals such as chrome/gold and aluminum. After the photoresist has been removed, as described in Example 1 using a pure oxygen plasma, a volatile organo silicon compound is introduced into the plasma. The organo silicon gas is mixed with the oxygen outside of the plasma region and then introduced into the chamber. Bis-(dimethylamino)-silane (Silar No. 1420) was used. This compound is completely oxidized to $SiO_2$ in the plasma region and the $SiO_2$ is carried by the gas stream and deposited on the substrate. The deposition rate of the $SiO_2$ layer is of the order of 2 to 10

A per minute. The substrate was exposed to the $SiO_2$ vapor for 30 minutes. Parallel alignment was obtained on the cell having the substrates treated in this manner.

EXAMPLE 3

A sustrate was prepared as in Example 2 but an organo tin compound, tetrabutyl tin, was used instead of the organo silicon compound. The tetrabutyl tin compound was oxidized completely to $SnO_2$. This compound was carrried by the gas stream and deposited on the substrate. Parallel alignment was obtained in the liquid crystal cell using these substrates and an alkyl cyano biphenyl.

EXAMPLE 4

Glass substrates were prepared as in Example 1 and the photoresist residue removed by an oxygen plasma. The oxygen was stopped and tetrafluoromethane, $CF_4$, was introduced into the plasma generating region to form fluorine radicals. The exposure to the flourine radical continued for 30 minutes. Both ITO layer and the glass substrate were rich in F an O. The resultant substrates were used in a liquid crystal cell containing an alkyl cyano biphenyl. The resultant cell had complete perpendicular alignment, that is the alignment was perpendicular to the substrate surface. The resistivity of the cell can be reduced by exposure to a 95% $N_2$: 5% $H_2$ gas treatment as described above in Example 1.

EXAMPLE 5

A substrate containing a portion of tin doped indium oxide and a substrate containing a portion of tin doped indium oxide and a substrate containing a portion of aluminum were placed in the chamber and subjected to an oxygen treatment as described above to remove the photoresist. The equipment was purged of oxygen by passing Argon therethrough. The substrates were positioned so that they were within serveral inches of the plasma region. Tetrafluoroethylene was then introduced to form fluorine containing free radicals suitable for polymerization. It is believed that the free radicals formed are $CF_2-CF_2$ and $CF_2$. These excited species or free radicals have a limited life and must reach the substrate surface within their mean free path distance, that is several inches. As before, electron or ion bombardment of the film had to be avoided. The free radicals produced a conforming film on top of the glass substrate and the conductive metal portions. The deposition rate was of the order 2 to 5 A per minute. The fluorinated polymeric film had a volume resistivity of $10^{13}$ ohm centimeters.

Although several preferred embodiments of this invention have been described, it is understood that numerous variations may be made in accordance with the principles of this invention.

We claim:

1. A method for producing a surface suitable for forcing a selected alignment in a liquid crystal display cell comprising the steps of
forming free radicals in an r.f. plasma of one species taken from the group of oxygen free radicals and fluorine free radicals, and
exposing a substrate to said free radicals while said substrate is positioned away from said r.f. plasma to form said surface, said surface forcing a parallel alignment with said surface when only said oxygen free radicals are formed, said surface forcing a perpendicular alignment to said surface when said fluorine free radicals are formed.

2. A method as described in claim 1 whereby said substrate is taken from the group of glass and indium-tin oxide.

3. A method as described in claim 1 whereby said liquid crystal cell contains a positive dielectric liquid crystal material.

4. A method as described in claim 1 whereby fluorine free radicals are formed in a tetrafluoromethane plasma.

5. A method as described in claim 1 whereby the substrate is first exposed to oxygen free radicals and subsequently exposed to fluorine free radicals to form a surface adapted to force a perpendicular alignment to said surface.

6. A method as described in claim 1 including the additional step of exposing said free radical treated surface to a hydrogen containing plasma whereby the resistivity of said surface is lowered.

7. A method for producing a surface film suitable for forcing a perpendicular alignment in a liquid crystal display cell comprising the steps of,
forming molecular excited species containing fluorine in an r.f. plasma, said species adapted to polymerize away from said plasma, and
exposing a substrate to said excited species while said substrate is positioned away from said plasma to form a surface film on said substrate by the in situ polymerization of said excited species.

8. A method as described in claim 7 whereby said excited species is formed from a polyfluorinated ethylene derivative.

9. A method as described in claim 7 whereby said excited species is formed from tetrafluoroethylene.

10. A method as described in claim 7 whereby said surface is taken from the group consisting of glass, indium-tin oxide, chrome/gold and aluminum.

11. A method as described in claim 7 including the step of exposing the substrate to oxygen free radicals prior to forming molecular excited species containing fluorine.

12. A method for producing a surface film suitable for forcing a parallel alignment in a liquid crystal display cell comprising the steps of,
forming oxygen free radicals in an r.f. plasma,
introducing a compound taken from the group consisting of volatile silicon compounds and volatile organic tin compounds into said plasma, and
exposing a substrate to said free radicals away from said r.f. plasma to form a surface film on said substrate.

13. A method as described in claim 12 whereby argon gas is mixed with said oxygen free radicals.

14. A method as described in claim 12 whereby said compound is tetrabutyl tin.

* * * * *